United States Patent
Hattori et al.

(10) Patent No.: US 8,653,740 B2
(45) Date of Patent: Feb. 18, 2014

(54) LOAD CONTROL CIRCUIT

(75) Inventors: Takeshi Hattori, Okazaki (JP);
Shigekazu Sugimoto, Takahama (JP);
Nobutomo Takagi, Okazaki (JP)

(73) Assignee: Anden Co., Ltd., Anjo (JP)

( * ) Notice: Subject to any disclaimer, the term of this patent is extended or adjusted under 35 U.S.C. 154(b) by 627 days.

(21) Appl. No.: 12/913,313

(22) Filed: Oct. 27, 2010

(65) Prior Publication Data

US 2011/0101886 A1 May 5, 2011

(30) Foreign Application Priority Data

Oct. 30, 2009 (JP) ................................. 2009-250589
Oct. 19, 2010 (JP) ................................. 2010-234358

(51) Int. Cl.
*H05B 37/02* (2006.01)

(52) U.S. Cl.
USPC ......... 315/209 R; 315/291; 315/307; 315/308

(58) Field of Classification Search
USPC ............. 315/209 R, 224, 225, 307, 245, 302, 315/308, 82, 83, 291, DIG. 7; 323/234, 905; 363/22–24, 74, 149
See application file for complete search history.

(56) References Cited

U.S. PATENT DOCUMENTS 6,548,966 B2 * 4/2003 Kawasaka et al. ............ 315/291
7,274,152 B2 * 9/2007 Suzuki et al. ................. 315/219

FOREIGN PATENT DOCUMENTS

JP A-2009-065246 3/2009

* cited by examiner

*Primary Examiner* — Daniel Cavallari
*Assistant Examiner* — Borna Alaeddini
(74) *Attorney, Agent, or Firm* — Posz Law Group, PLC

(57) ABSTRACT

A switch device controls a voltage applied to a load element according to an electric power supply from a power source. A driver circuit controls activation and deactivation of the switch device. A circuit portion sets a duty ratio and output the duty ratio to the driver circuit for causing the driver circuit to activate the switch device according to the duty ratio to control a voltage applied to the load element. The circuit portion sets the duty ratio according to a duty ratio characteristic curve. In the duty ratio characteristic curve, the duty ratio decreases gradually with increase in a voltage of the power source, and decrease in the duty ratio with increase in the voltage of the power source becomes small gradually.

5 Claims, 7 Drawing Sheets

| VOLTAGE [V] | DUTY [%] | ILLUMINATION [LX] | EFFECTIVE VALUE $[(V^2 \times DUTY)^{1/2}]$ |
|---|---|---|---|
| 14 | 94.7 | 792 | 13.63 |
| 15 | 82.5 | 792 | 13.62 |
| 16 | 73.0 | 792 | 13.67 |
| 17 | 64.8 | 792 | 13.69 |
| 18 | 57.4 | 792 | 13.64 |

| VOLTAGE [V] | DUTY [%] | ILLUMINATION [LX] | EFFECTIVE VALUE [(V² × DUTY)^(1/2)] |
|---|---|---|---|
| 14 | 94.7 | 792 | 13.63 |
| 15 | 82.5 | 792 | 13.62 |
| 16 | 73.0 | 792 | 13.67 |
| 17 | 64.8 | 792 | 13.69 |
| 18 | 57.4 | 792 | 13.64 | ck
LOAD CONTROL CIRCUIT

CROSS REFERENCE TO RELATED APPLICATIONS

This application is based on and incorporates herein by reference Japanese Patent Applications No. 2009-250589 filed on Oct. 30, 2009 and No. 2010-234358 filed on Oct. 19, 2010.

FIELD OF THE INVENTION

The present invention relates to a load control circuit configured to supply electricity to a load thereby to control the load. More specifically, the present invention may relate to a load control circuit configured to cause a lamp, such as a filament-type lamp having a nonlinear voltage-illumination characteristic, to generate constant illumination.

BACKGROUND OF THE INVENTION

Publication of Japanese patent application 2009-65246 (JP-A-2009-65246) discloses a conventional load control apparatus configured to control a duty ratio of electricity supply so as to regulate fluctuation in a load, even when a voltage of a power source changes. Specifically, the load control apparatus supplies electricity such that a duty ratio becomes small as the effective value of electric power becomes large, thereby to regulate increase in an effective value of electric power of the load.

For example, a relay control circuit is configured to control supply of electricity to a coil of a relay switch thereby to control activation and deactivation of the relay switch. In general, such a relay control circuit is configured to perform a duty control of an energization period of a coil, when voltage of a power source changes, thereby to supply constant electricity to the coil.

It is noted that, a wattage (effective value of electric power) of a load, which is a filament-type lamp, is not in proportion to an illumination caused by the filament-type lamp. Accordingly, when the load control apparatus of JP-A-2009-65246 is employed as a lamp control circuit for controlling a filament-type lamp as a load, the lamp control circuit may be incapable of controlling the illumination of the filament-type lamp constantly. As a result, illumination of the lamp may be flickering.

A relay control circuit is configured to perform a duty control of an energization period. It is noted that increase in a coil current supplied to a coil may delay by a damping time constant. Therefore, even when the relay control circuit sets an energization period according to change in a voltage (power supply voltage) of a power source, a coil current may become insufficient. In such a case, electricity supply may become insufficient, and magnetism caused by the coil may change. Thus, the relay control circuit may become incapable of driving the relay device or maintaining activation of the relay device.

FIG. 12 is a time chart showing an ON-OFF waveform (activation and deactivation waveform) of a coil switch and a coil current waveform when a power supply voltage changes. As shown in FIG. 12, when the power supply voltage is in a normal voltage, a coil current increases to a desired current. Thus, the coil can be supplied with predetermined electric current. When the power supply voltage increases, the duty control may reduce the energization period. In this case, the energization period may end before the coil current reaches the desired current. Consequently, the coil current may become insufficient, and desired electric current may not be supplied to the coil.

In the present case, a relay control circuit is mentioned as one example of a circuit configured to supply electric current to a coil (load element). It is noted that, similar problem occurs not only in such a relay control circuit but also in a load control circuit configured to perform a duty control of electric current supplied to a coil (load element) thereby to activate and deactivate the coil.

As described above, a lamp control circuit may cause fluctuation (flickering) in lamp illumination, or a relay control circuit may cause fluctuation in magnetism generated by a coil. Consequently, desired state cannot be maintained in various load control circuits. Thus, useless power consumption may occur. In recent years, a gasoline vehicle (automotive) is substituted to, for example, a hybrid vehicle or an electric vehicle. Such a hybrid vehicle or an electric vehicle consumes a large amount of electricity. Thus, reduction in useless electric consumption is strongly desired. In consideration of such a background, reduction in useless electric consumption in a load control circuit is also desired.

SUMMARY OF THE INVENTION

In view of the foregoing and other problems, it is an object of the present invention to produce a load control circuit configured to regulate illumination of a lamp, such as a filament-type lamp having a nonlinear voltage-illumination characteristic, within a constant range thereby to reduce flickering of the lamp.

It is another object of the present invention to produce a load control circuit configured to regulate electric power supplied to a coil constantly regardless of change in a power supply voltage.

According to one aspect of the present invention, a load control circuit comprises a switch device configured to control a voltage applied to a load element according to an electric power supply from a power source. The load control circuit further comprises a driver circuit configured to control activation and deactivation of the switch device. The load control circuit further comprises a circuit portion configured to set a duty ratio and output the duty ratio to the driver circuit for causing the driver circuit to activate the switch device. The driver circuit is configured to activate the switch device according to the duty ratio to control the voltage applied to the load element. The circuit portion is further configured to set the duty ratio according to a duty ratio characteristic curve in which the duty ratio decreases gradually with increase in a voltage of the power source, and decrease in the duty ratio with increase in the voltage of the power source becomes small gradually.

According to another aspect of the present invention, the circuit portion may be a lamp control circuit including: a periodic waveform generator configured to generate a periodic voltage waveform; a threshold circuit configured to generate a threshold voltage to be compared with the periodic voltage waveform; and a comparator configured to: compare the periodic voltage waveform with the threshold voltage to obtain a comparison result; set a duty ratio to cause the driver circuit to activate the switch device according to the comparison result; and output the duty ratio to the driver circuit. The comparator may be configured to cause the driver circuit to activate the switch device according to the duty ratio outputted to the driver circuit to control a voltage applied to the lamp having a nonlinear voltage-illumination characteristic. The threshold circuit may be configured to output the threshold voltage, such that the threshold voltage satisfies a relationship obtained by approximating a characteristic curve of the duty ratio, which renders an illumination of the lamp substantially constant with increase in a voltage of the power source, by a linear-function straight line using a formula $(V^2 \times DUTY)^{1/2}$ of an effective value of a voltage applied to the lamp, the DUTY being the duty ratio, and the V being the applied voltage to the lamp.

According to another aspect of the present invention, the circuit portion may be a relay control circuit including: a periodic waveform generator configured to generate a periodic voltage waveform; a threshold circuit configured to generate a threshold voltage to be compared with the periodic voltage waveform; and a comparator configured to: compare the periodic voltage waveform with the threshold voltage to obtain a comparison result; set a duty ratio to cause the driver circuit to activate the switch device according to the comparison result; and output the duty ratio to the driver circuit. The comparator may be configured to output the duty ratio to the driver circuit to activate the switch device according to the duty ratio to control a coil current supplied to a relay coil thereby to activate a relay switch. The threshold circuit may be configured to: approximate the duty ratio characteristic curve to a linear-function straight line, such that a duty ratio, which is on the linear-function straight line and corresponds to a predetermined voltage, becomes greater than a duty ratio, which is on the duty ratio characteristic curve and corresponds to a power supply voltage being the predetermined voltage; set the duty ratio using the linear-function straight line; and output the threshold voltage to cause the duty ratio.

BRIEF DESCRIPTION OF THE DRAWINGS

The above and other objects, features and advantages of the present invention will become more apparent from the following detailed description made with reference to the accompanying drawings.

In the drawings.

DETAILED DESCRIPTION OF PREFERRED EMBODIMENTS

Figures 1, 2:
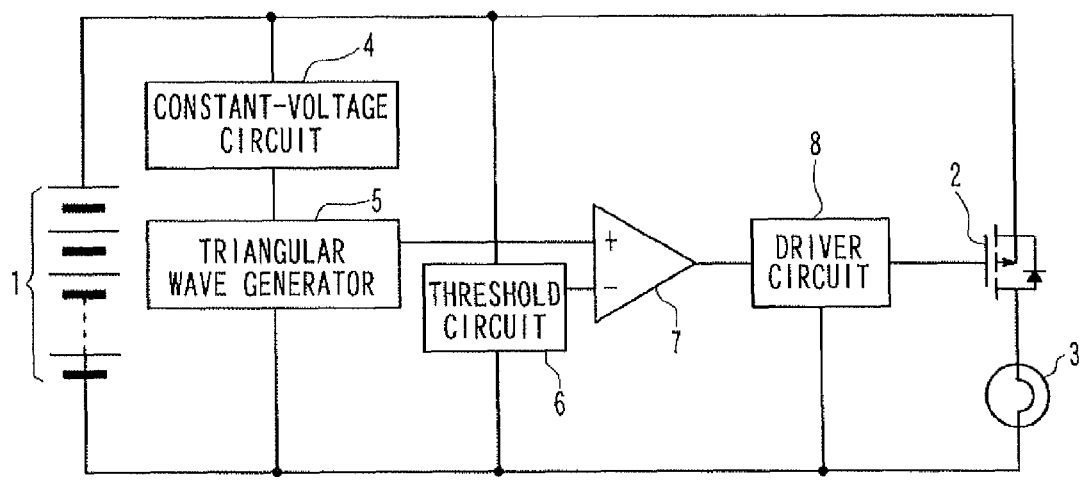
FIG. 1 is a circuit diagram showing a lamp control circuit according to a first embodiment of the present invention.
FIG. 2 is a view showing an example of a relationship between a voltage and an effective value when a lamp consumes a constant power such as 55 watt.

As follows, embodiments of the present invention will be described with reference to drawings. In each of the following embodiments, the same elements or equivalent elements are denoted by the same reference numeral in the drawings.

(First Embodiment)

FIG. 1 is a circuit diagram showing a lamp control circuit (load control circuit) according to the present embodiment. As follows, the lamp control circuit will be described in detail with reference to drawings.

The lamp control circuit shown in FIG. 1 is used for controlling a filament-type lamp such as a headlamp and a brake lamp of a vehicle. As shown in FIG. 1, the lamp control circuit is activated with power supply from a battery 1 functioning as a power source. Specifically, when a user activates a start switch device, which is currently being deactivated, a lamp 3 is applied with voltage from the battery through a semiconductor switching element 2, thereby the lamp 3 is activated. The semiconductor switching element 2 is configured of, for example, a MOS transistor to function as a switch device.

The lamp control circuit further includes a constant-voltage circuit 4, a triangular wave generator 5, a threshold circuit 6, a comparator 7, and a driver circuit 8.

The constant-voltage circuit 4 generates a constant voltage according to the voltage of the battery 1 and applies the generated voltage to the triangular wave generator 5.

The triangular wave generator 5 generates a triangular voltage waveform as a fundamental waveform for setting a duty ratio for a duty control or a pulse width for a PWM control. The triangular wave generator 5 is equivalent to a periodic waveform generator. In the present embodiment, the triangular wave is used as a fundamental waveform of a periodic waveform. It is noted that a rectangular wave, a sine wave, or the like may be used as a fundamental waveform.

The threshold circuit 6 sets a threshold voltage Vc, which is to be compared with the triangular waveform generated by the triangular wave generator 5. The threshold circuit 6 sets the threshold voltage Vc to set the duty ratio so as to regulate illumination within a constant range so as not to cause flickering in illumination generated by the lamp 3. A method for setting the threshold voltage Vc will be described later in detail.

The comparator 7 compares a quantity of the triangular wave generated by the triangular wave generator 5 with a quantity of the threshold voltage Vc set by the threshold circuit 6. The comparator 7 further generates an output signal according to a result of the comparison. Specifically, the comparator 7 outputs a high-level signal when the voltage of the triangular wave is greater than the threshold voltage Vc and outputs a low-level signal when the voltage of the triangular wave is less than the threshold voltage Vc. Thus, as the threshold voltage Vc set by the threshold circuit 6 becomes high, a period, in which the high-level signal is outputted, become short. Consequently, the duty ratio becomes small to reduce activation of the semiconductor switching element 2. Alternatively, as the threshold voltage Vc becomes low, a period, in which the high-level signal is outputted, become long. Consequently, the duty ratio becomes large.

The driver circuit 8 controls activation and deactivation of the semiconductor switching element 2 according to the output signal of the comparator 7, thereby to control a voltage-application period to the lamp 3. The driver circuit 8 generally activates the semiconductor switching element 2 while the comparator 7 outputs the high-level signal and deactivates the semiconductor switching element 2 while the comparator 7 outputs the low-level signal. The driver circuit 8 has an over-voltage protection function and the like. Therefore, the driver circuit 8 further controls to deactivate the semiconductor switching element 2 when detecting overvoltage in a power supply line of the lamp 3.

Subsequently, a method for setting the threshold voltage Vc so as to render the illumination of the lamp 3 constant will be described. FIG. 2 shows calculation results of a relationship between a voltage and an effective value when the lamp 3 is applied with a constant wattage such as 55 watt. The present effective value is expressed by $(V^2 \times DUTY)^{1/2}$, wherein the "V" is a voltage applied to the lamp 3, and the "DUTY" is a duty ratio of the voltage applied to the lamp 3.

As shown in FIG. 2, so as to render the illumination constant at 792 lx when the voltage of the battery 1 changes in the range of 14 to 18 volt, it is necessary not to render the wattage (effective value of electric power) constant in a conventional way but to render the effective value $(V^2 \times DUTY)^{1/2}$ of the applied voltage to the lamp 3 constant. Specifically, the wattage (effective electricity) is not in proportion to the illumination in a case of the filament-type lamp 3. Therefore, even when the wattage is rendered constant, the illumination is not necessarily rendered constant. On the contrary, according to FIG. 2, the effective value $(V^2 \times DUTY)^{1/2}$ of the voltage applied to the lamp 3 is substantially in proportion to the illumination. Specifically, when the illumination is constant at 792 lx, the effective value $(V^2 \times DUTY)^{1/2}$ is substantially constant at 13.6. From this, it is confirmed that the illumination is substantially in proportion to the effective value $(V^2 \times DUTY)^{1/2}$.

Figure 3:
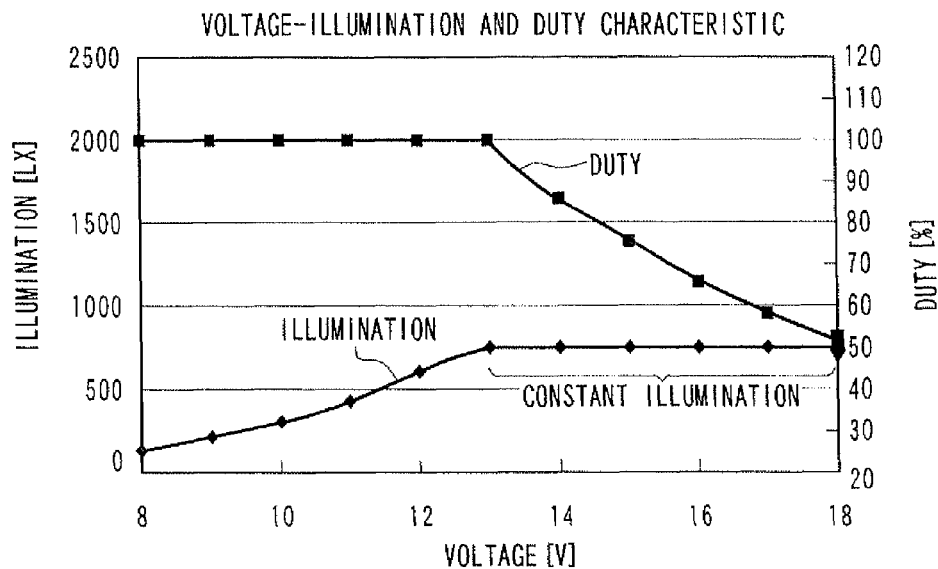
FIG. 3 is a graph showing an example of a duty ratio required to render an illumination of the lamp constant when a voltage of a battery increases to 8 volt or more.

FIG. 3 is a graph showing a duty ratio required to render the illumination constant when, for example, the voltage of the battery 1 increase to, for example, 13 volt or more. The illumination of the lamp 3 increases exponentially with increase in the voltage of the battery 1. Therefore, when the voltage of the battery 1 decreases, change in the illumination of the lamp 3 is not so large. Nevertheless, when the voltage of the battery 1 increases, the illumination of the lamp 3 changes drastically.

In view of this, when the voltage of the battery 1 becomes greater than 13 volt, the duty control is started to render the illumination constant so as to restrain flickering of the lamp 3. As described above, the duty ratio, which enables to render the illumination constant, is not proportional to the wattage (effective value of electric power) but proportional to the effective value $(V^2 \times DUTY)^{1/2}$ of the applied voltage to the lamp 3. Therefore, the duty ratio in FIG. 2 calculated to conform to the characteristic of the lamp 3 has a property shown in FIG. 3.

As stated above, the duty control is started to set the duty ratio only when the voltage of the battery 1 is greater than or equal to 13 volt. In view of this, it suffices that the threshold voltage Vc is set according to a characteristic curve of the duty ratio when the voltage of the battery 1 is greater than or equal to 13 volt. Specifically, according to the characteristic curve of the duty ratio shown in FIG. 3, the duty ratio decreases gradually with increase in the voltage of the battery 1, and decrease in the duty ratio with increase in the voltage of the battery 1 becomes small gradually. It suffices that the threshold voltage Vc is set according to the characteristic curve of the duty ratio.

In consideration of this, according to the present embodiment, linear approximation is performed to the characteristic curve of the duty ratio when the voltage of the battery 1 is greater than or equal to 13 volt. The threshold circuit 6 is caused to set the threshold voltage Vc to control the duty ratio to conform to the approximated linear-function straight line. In this way, a desired duty ratio according to the voltage of the battery 1 can be obtained. In view of the foregoing, in the present embodiment, the duty ratio relative to the voltage of the battery 1 is obtained to enable to render the illumination of the lamp 3 constant in the following way. The characteristic curve of the duty ratio may be approximated by one straight line and may be approximated by two or more straight lines. In the present embodiment, the characteristic curve of the duty ratio is approximated by one straight line.

Figure 4:
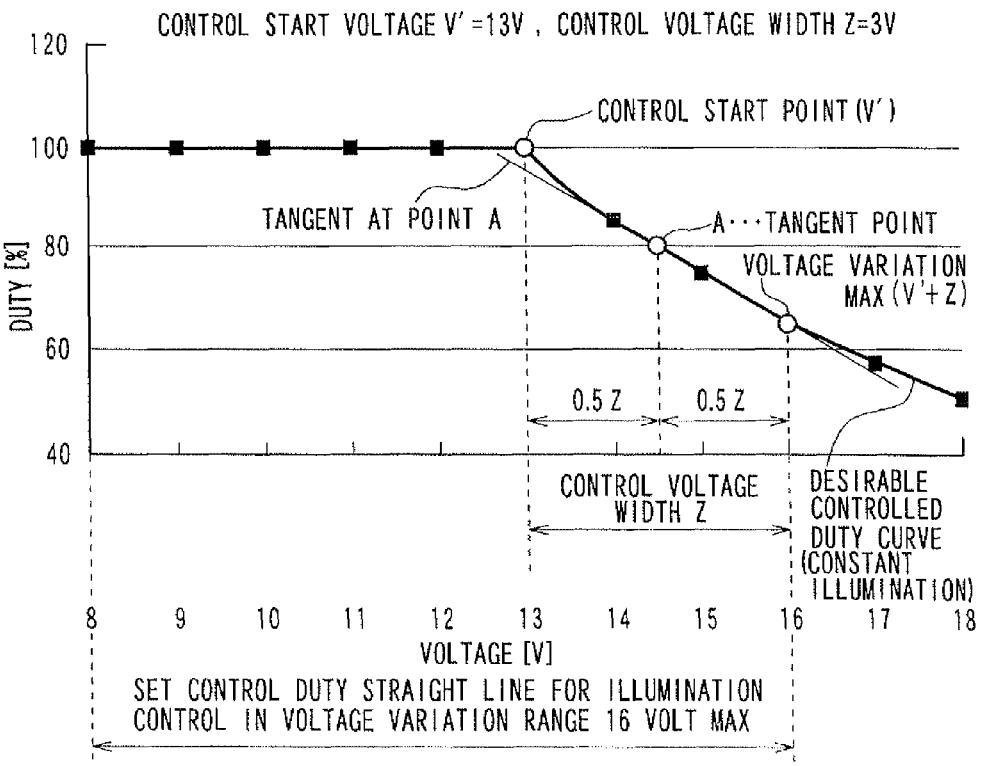
FIG. 4 is an explanatory view for a method of liner approximation with a single straight line.

FIG. 4 is an explanatory view for a method of the liner approximation. In the present example, the linear approximation is performed on assumption that the voltage of the battery 1 at a control start point (V') of the duty control is 13 volt, and the maximum value (V'+Z) of the voltage of the battery 1 is 16 volt, wherein a control voltage width Z is the maximum voltage variation of the battery 1.

First, on assumption that the voltage of the battery 1 varies between 13 volt and 16 volt, and the voltage range of the battery 1 is the control voltage width Z, the control voltage width Z is divided into two ranges each being 0.5Z, and a point A is set to the position of 0.5Z from 13 volt. In this case, a tangent line at the point A is an approximation straight line between 13 volt and 16 volt.

More specifically, the illumination of the lamp 3 is X, and an α is a constant value. On this premise, the illumination X, the effective value $(V^2 \times DUTY)^{1/2}$ of the applied voltage to the lamp 3, and the DUTY satisfy the following formula.

$$X = \alpha \times (V^2 \times DUTY)^{1/2} \tag{1}$$

The following formula (2) of the DUTY is obtained by converting the formula (1). The formula (2) is a function formula expressing the DUTY in FIG. 3. In the formula (2), $(X/\alpha)^2$ is a characteristic value. Therefore, the formula (3) can be obtained from the formula (2) by substituting γ for $(X/\alpha)^2$.

$$DUTY = (X/\alpha)^2 \times (1/V^2) \tag{2}$$

$$DUTY = \gamma \times (1/V^2) \tag{3}$$

Therefore, the following formula (4) is obtained from the formula (3) by substituting the DUTY=1 and $\gamma = V'^2$ corresponding to the voltage V' at the control start point.

$$DUTY = V'^2 \times (1/V^2) \tag{4}$$

The following formula (5) can be obtained from differentiation of the formula (4) with respect to the voltage V. Subsequently, the formula (6) expressing the inclination a of the tangent at the point A can be obtained by substituting the voltage (V=V'+0.5Z) at the point A for the voltage V in the formula (5).

$$dDUTY = -2V'^2/V^3 \tag{5}$$

$$a = -2V'^2/(V'+0.5Z)^3 \tag{6}$$

On assumption that the approximated linear-function straight line is defined by a linear function of DUTY=aV+b, the section b of the linear function can be obtained by, for example, substituting the voltage and the duty ratio at the point A for the voltage V and the DUTY of the linear function. In this way, the linear function specifying the tangent at the point A can be obtained.

The relationship between the voltage of the battery 1 and the duty ratio may be approximated by a linear-function straight line throughout the range between 13 volt and 16 volt of the voltage of the battery 1. In this case, when variation in the voltage V becomes large, a deviation between an actual duty characteristic curve and the approximated linear-function straight line becomes large. Nevertheless, it is noted that flickering of the lamp 3 is recognized by eyes of a user when variation in the illumination of the lamp 3 exceeds a certain range. Accordingly, when variation in the illumination of the lamp 3 is within the certain range, flickering of the lamp 3 is not recognized by eyes of a user. In view of this, the illumination of the lamp 3 can be regulated within a certain range simply by approximating the relationship between the voltage of the battery 1 and the duty ratio to a linear-function straight line.

As stated, the linear function can be obtained by approximating the relationship between the voltage of the battery 1 and the duty ratio by a straight line, in this way. Thus, the threshold circuit 6 is caused to store the linear function and set the threshold voltage Vc so as to cause the duty ratio to conform to the approximated linear-function straight line.

Figure 5:
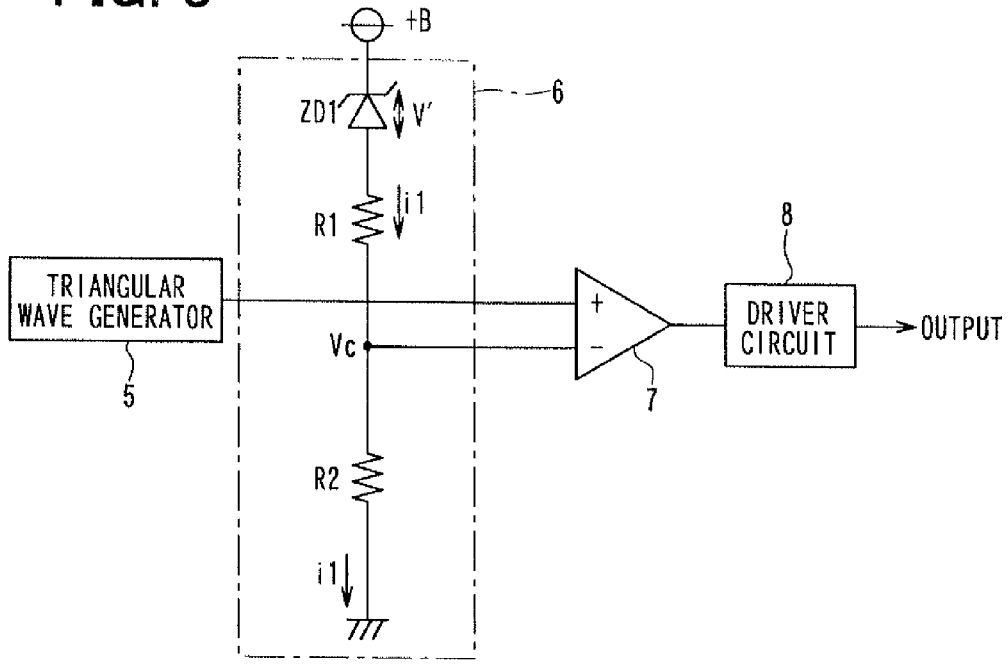
FIG. 5 is a circuit diagram showing one example of a circuit structure of a threshold circuit in a case where a relationship between the voltage of the battery and the duty ratio is approximated by two linear-function straight lines.

FIG. 5 is a circuit diagram showing one example of a circuit structure of the threshold circuit 6 in the case where the relationship between the voltage of the battery 1 and the duty ratio is approximated by a single linear-function straight line.

As shown in FIG. 5, a first zener diode ZD1 having a zener breakdown voltage V' and a voltage divider resistor are provided. The voltage divider resistor includes a first resistor element R1 and a second resistor element R2. The first zener diode ZD1 is located on the high-voltage side of the first and second resistor elements R1, R2, thereby to regulate voltage to be divided by the voltage divider resistor. In the present structure, the threshold circuit 6 divides the voltage when the voltage becomes greater than or equal to a predetermined voltage, thereby to cause the threshold voltage Vc corresponding to the approximated linear function.

Specifically, when the voltage of the battery 1 is in the range between the voltage V' (=13 volt) at the start point of the duty control and the voltage V'+Z (=16 volt) including the control voltage width Z, the first zener diode ZD1 of the threshold circuit 6 conducts an electric current. Thereby, the first and second resistor elements R1, R2 of the voltage divider resistor divide the voltage of the battery 1 to cause the threshold voltage Vc at the intermediate point between the first and second resistor elements R1, R2. The threshold voltage Vc is calculated by multiplying an electric current i1, which flows through the first and second resistor elements R1, R2 and changes according to the voltage of the battery 1, by the resistance of the second resistor element R2. Therefore, the threshold voltage Vc changes correspondingly to the voltage of the battery 1 when the voltage of the battery 1 is high. The threshold voltage Vc uniquely corresponds to the values of the resistance of the first and second resistor elements R1, R2. Therefore, the threshold voltage Vc can be caused correspondingly to the approximated linear-function straight line by arbitrarily selecting values of the resistance of the first and second resistor elements R1, R2.

Figure 6:
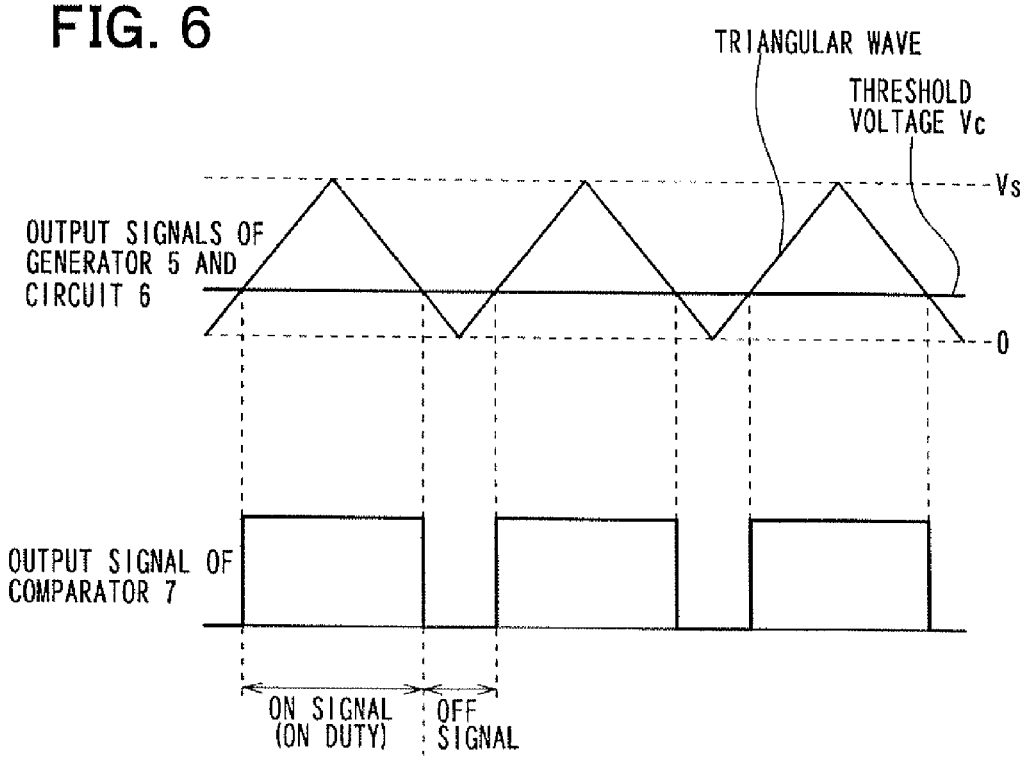
FIG. 6 is a timing chart showing a relationship between a triangular wave and a threshold voltage and an output signal of a comparator according to the duty ratio.

The threshold voltage Vc is set correspondingly to the approximated linear-function straight line in this way. In addition, comparison between the threshold voltage Vc and the voltage of the triangular wave generated by the triangular wave generator 5 is performed to set the substantially constant effective value $(V^2 \times DUTY)^{1/2}$ of the applied voltage to the lamp 3. Thus, the duty ratio can be set to render the illumination of the lamp 3 substantially constant. FIG. 6 is a timing chart showing a relationship between the triangular wave and the threshold voltage Vc. FIG. 6 further shows ON and OFF signals (activation and deactivation signals) outputted from the comparator 7 according to the duty ratio. As shown in FIG. 6, the comparator 7 outputs a signal of the duty ratio according to the threshold voltage Vc. The threshold voltage Vc changes correspondingly to the voltage of the battery 1. Therefore, the duty ratio changes correspondingly to the voltage of the battery 1. The values of the resistance of the first and second resistor elements R1, R2 are selected to regulate the effective value $(V^2 \times DUTY)^{1/2}$ of the applied voltage to the lamp 3 within a certain range. Therefore, the illumination of the lamp 3 can be regulated in a certain range.

As described above, according to the present embodiment, the threshold is set according to the characteristic curve of the duty ratio in which the duty ratio decreases gradually with increase in the voltage of the battery 1, and decrease in the duty ratio with increase in the voltage of the battery 1 becomes small gradually.

Specifically, in order to regulate the illumination of the filament-type lamp 3 within a certain range, the duty ratio of the duty control is determined such that the illumination of the lamp 3 becomes constant even when the voltage of the battery 1 changes. Further, the curve representing the relationship between the duty ratio and the voltage V of the battery 1 corresponding to the duty ratio is approximated by the linear-function straight line. Thus, the threshold circuit 6 sets the threshold voltage Vc to produce the characteristic of the approximated linear-function straight line. The approximated linear-function straight line is calculated based on the relationship between the duty ratio and the effective value $(V^2 \times DUTY)^{1/2}$ of the voltage applied to the lamp 3. Therefore, the linear approximation can be correctly performed to enable to render the illumination of the lamp 3 further constant. In this way, the illumination of the filament-type lamp 3 can be regulated within a certain range. Thus, the lamp control circuit configured to restrict flickering of the lamp 3 can be produced.

(Second Embodiment)

As follows, the second embodiment will be described. In the first embodiment, the portion of the duty ratio characteristic curve, in which the voltage of the battery 1 is greater than or equal to 13 volt, is approximated by the single linear-function straight line. Contrary, in the present embodiment, the duty ratio characteristic curve is approximated by two linear-function straight lines. The structure of the lamp control circuit in the present embodiment is substantially similar to that of the first embodiment. In the present embodiment, only the structure of the threshold circuit 6 of the lamp control circuit is modified. Therefore, only subjects different from those in the first embodiment will be described.

In the present embodiment, the duty ratio relative to the voltage of the battery 1 is obtained to enable to render the illumination of the lamp 3 constant in the following way.

Figure 7:
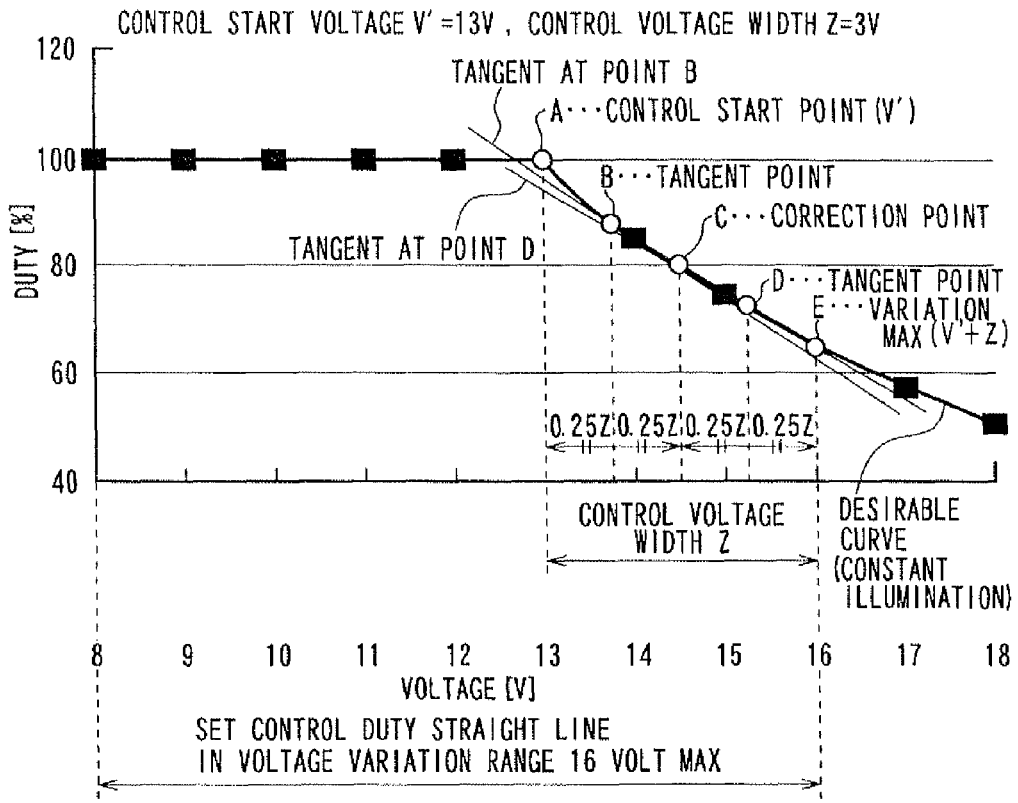
FIG. 7 is an explanatory view for a method of liner approximation with two straight lines.

FIG. 7 is an explanatory view for a method of the liner approximation according to the present embodiment. First, on assumption that the voltage of the battery 1 varies between 13 volt and 16 volt, and the voltage range of the battery 1 is the control voltage width Z, the control voltage width Z is divided into four ranges each being 0.25Z, and points A to E are set to the positions between 13 volt and 16 volt. Further, the region between the point A and the point C is approximated by a single straight line. The point C is determined as a correction point of the inclination of the approximated straight line.

Further, the region between the point C and the point E is approximated by another single straight line.

Specifically, the region between the point A and the point C is approximated by obtaining a tangent on the point B, which is the center of the region. The region between the point C and the point E is approximated by obtaining a tangent on the point D, which is the center of the region.

The method for approximating by the liner straight lines at the point B and the point D may be similar to that described in the first embodiment. Specifically, for example, the voltage at the point B and the point D may be substituted for V in the formula (5) described in the first embodiment to calculate the inclinational of the tangent at the point B as specified by the formula (7) and the inclination a2 of the tangent at the point D as specified by the formula (8).

$$dDUTY=a1=-2V^2/(V+0.25Z)^3 \quad (7)$$

$$dDUTY=a2=-2V^2/(V+0.75Z)^3 \quad (8)$$

On assumption that the approximated linear-function straight line is defined by a linear function of DUTY=a1V, the section b1 of the linear function can be obtained by, for example, substituting the voltage and the duty ratio at the point B for the voltage V and the DUTY of the linear function. In this way, the linear function specifying the tangent at the point B can be obtained. Similarly, on assumption that the approximated linear-function straight line is defined by a linear function of DUTY=a2V+b2, the section b2 of the linear function can be obtained by, for example, substituting the voltage and the duty ratio at the point D for the voltage V and the DUTY of the linear function. In this way, the linear function specifying the tangent at the point D can be obtained.

As described in the first embodiment, the entire region corresponding to the range, in which the voltage of the battery 1 changes between 13 volt and 16 volt, may be approximated by a single linear-function straight line. When the voltage of the battery 1 changes over a wide range, deviation between an actual duty characteristic curve and the approximated linear-function straight line becomes large. Therefore, as described in the present embodiment, it may be preferable to determine the point C as the correction point of the inclination of the linear-function straight line and approximate by the two linear-function straight lines to reduce the deviation between the actual duty characteristic curve and the approximated linear-function straight lines.

As stated, the linear function can be obtained by approximating the relationship between the voltage of the battery 1 and the duty ratio by a straight line, in this way. Thus, the threshold circuit 6 is caused to set the threshold voltage Vc so as to cause the duty ratio to conform to the approximated linear-function straight line.

Figure 8:
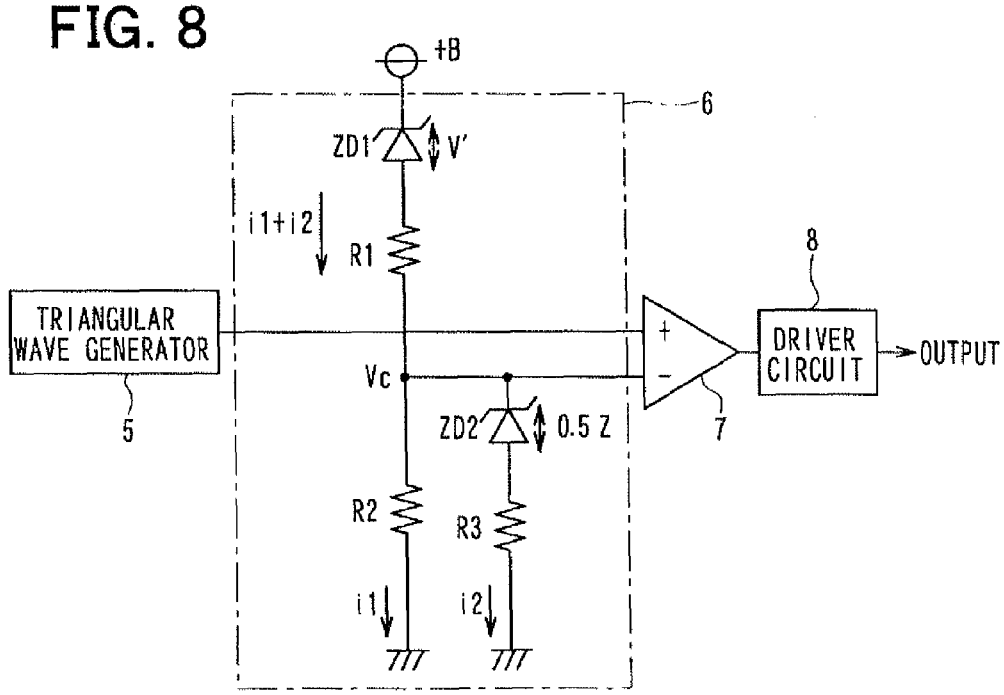
FIG. 8 is a circuit diagram showing one example of a circuit structure of a threshold circuit in a case where a relationship between the voltage of the battery and the duty ratio is approximated by two linear-function straight lines.

FIG. 8 is a circuit diagram showing one example of a circuit structure of the threshold circuit 6 in the case where the relationship between the voltage of the battery 1 and the duty ratio is approximated by two linear-function straight lines.

As shown in FIG. 8, a first zener diode ZD1 having a zener breakdown voltage V' and a voltage divider resistor are provided. The voltage divider resistor includes a first resistor element R1 and a second resistor element R2. The present voltage divider resistor causes the threshold voltage Vc corresponding to the linear function approximated by the first straight line. In addition, a second zener diode ZD2 having a zener breakdown voltage 0.5Z and a third resistor element R3 are provided. The second zener diode ZD2 is connected to an intermediate point between the first resistor element R1 and the second resistor element R2. The present circuit causes the threshold voltage Vc corresponding to the linear function approximated by the second straight line.

When the voltage of the battery 1 is in the range between the voltage V' (=13 volt) at the start point of the duty control and the voltage (=V'+0.5Z) at the point C being the correction point of the inclination, the first zener diode ZD1 of the threshold circuit 6 conducts an electric current. Thereby, the first and second resistor elements R1, R2 of the voltage divider resistor divides the voltage of the battery 1 to cause the threshold voltage Vc at the intermediate point between the first and second resistor elements R1, R2. The threshold voltage Vc at this time is changed correspondingly to the voltage of the battery 1, when the voltage of the battery 1 is high, and uniquely determined according to the resistance of the first and second resistor elements R1, R2. Therefore, the threshold voltage Vc corresponding to the first approximated linear-function straight line can be obtained by arbitrarily selecting the resistance of the first and second resistor elements R1, R2. At this time, the threshold voltage Vc does not reach the zener breakdown voltage (=0.5Z) of the second zener diode ZD2. Therefore, the second zener diode ZD2 does not conduct an electric current.

Subsequently, when the voltage of the battery 1 becomes greater than or equal to the voltage (=V'+0.5Z) at the C point, which is the correction point, the second zener diode ZD2 conducts an electric current. The second resistor element R2 and the third resistor element R3, which are connected in parallel, have the combined resistance. The divided resistance of the first resistor element R1 and the combined resistance causes the threshold voltage Vc. The threshold voltage Vc at this time is changed correspondingly to the voltage of the battery 1, when the voltage of the battery 1 is high, and uniquely determined according to the resistance of the first, second, and third resistor elements R1, R2, R3. Therefore, The threshold voltage Vc corresponding to the second approximated linear-function straight line can be obtained by arbitrarily selecting the resistance of the first, second, and third resistor elements R1, R2, R3.

The threshold voltage Vc is set correspondingly to the approximated linear-function straight line in this way. In addition, comparison between the threshold voltage Vc and the voltage of the triangular wave generated by the triangular wave generator 5 is performed to set the substantially constant effective value $(V^2 \times DUTY)^{1/2}$ of the applied voltage to the lamp 3. Thus, the duty ratio can be set to render the illumination of the lamp 3 substantially constant.

As described above, in the linear approximation, a slight deviation is caused between the approximated straight line and the characteristic curve, which represents the relationship between the voltage enabling to render the illumination of the lamp 3 constant and the duty ratio. According to the present embodiment, the two straight lines are used in the linear approximation to render the deviation smaller compared with the linear approximation using the single straight line in the first embodiment. In particular, in the linear approximation using the single straight line according to the first embodiment, the deviation becomes large at the control start point A (voltage V') and the point E at which variation in the voltage (V'+Z) of the battery 1 becomes the maximum value. Contrary, in the linear approximation using the two straight lines according to the present embodiment, the deviation can be sufficiently reduced at the points A, E.

Therefore, the linear approximation can be further correctly performed to render the illumination of the lamp 3 constant. In this way, the illumination of the filament-type lamp 3 can be further maintained at a constant value. Thus, the lamp control circuit configured to restrict flickering of the lamp 3 can be produced.

(Third Embodiment)

As follows, the third embodiment will be described. In the present embodiment, a load control circuit according to one embodiment of the present invention is applied to a relay control circuit.

Figure 9:
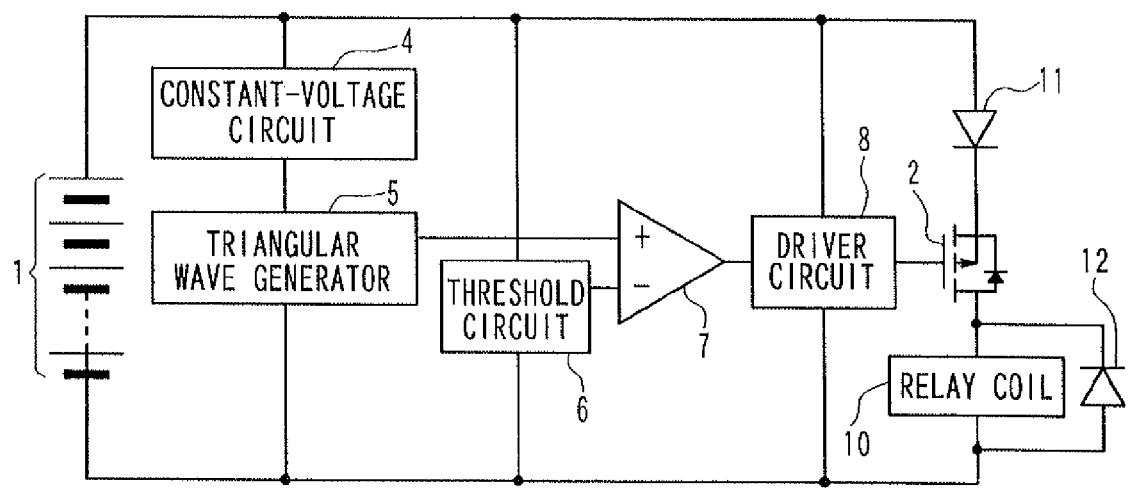
FIG. 9 is a circuit diagram showing a relay control circuit according to a third embodiment of the present invention.

FIG. 9 is a circuit diagram showing a relay control circuit according to the present embodiment. The relay control circuit shown in FIG. 9 includes components substantially equivalent to the components of the above-described lamp control circuit. Therefore, components of the relay control circuit substantially equivalent to those of the lamp control circuit are denoted by the same reference numerals, and description of those components are omitted.

The relay control circuit shown in FIG. 9 activates and deactivates the semiconductor switching element 2 according to an output signal from the driver circuit 8 thereby to perform an on-off control of a coil current supplied to the relay coil 10. Specifically, the relay control circuit causes supply of an electric current to the relay coil 10 thereby to activate a relay switch (not shown) of the relay coil 10 to supply an electric current to a load element connected with the relay switch. Alternatively, the relay control circuit terminates supply of an electric current to the relay coil 10 thereby to deactivate the relay switch of the relay coil 10 to terminate the electric current supplied to the load element connected with the relay switch. In the present example, a diode 11 and a diode 12 are provided as protection devices to the relay control circuit. The diode 11 is connected on the high-voltage side of the semiconductor switching element 2 in series. The diode 12 is connected in parallel with the relay coil 10. The diode 11 and the diode 12 may be arbitrary provided to the relay control circuit and may be omitted.

The present relay control circuit is configured to perform a duty control such that the relay control circuit variably sets a duty ratio according to the voltage of the battery 1 (power source) thereby to maintain the coil current constantly. As described above, increase in the coil current supplied to the relay coil 10 delays by the damping time constant. Therefore, even when the relay control circuit sets the energization period in proportion to fluctuation in the voltage of the battery 1, the coil current may become insufficient. In consideration of this, the relay control circuit according to the present embodiment sets the duty ratio in the following way. The present operation will be described with reference to FIG. 10.

Figure 10:
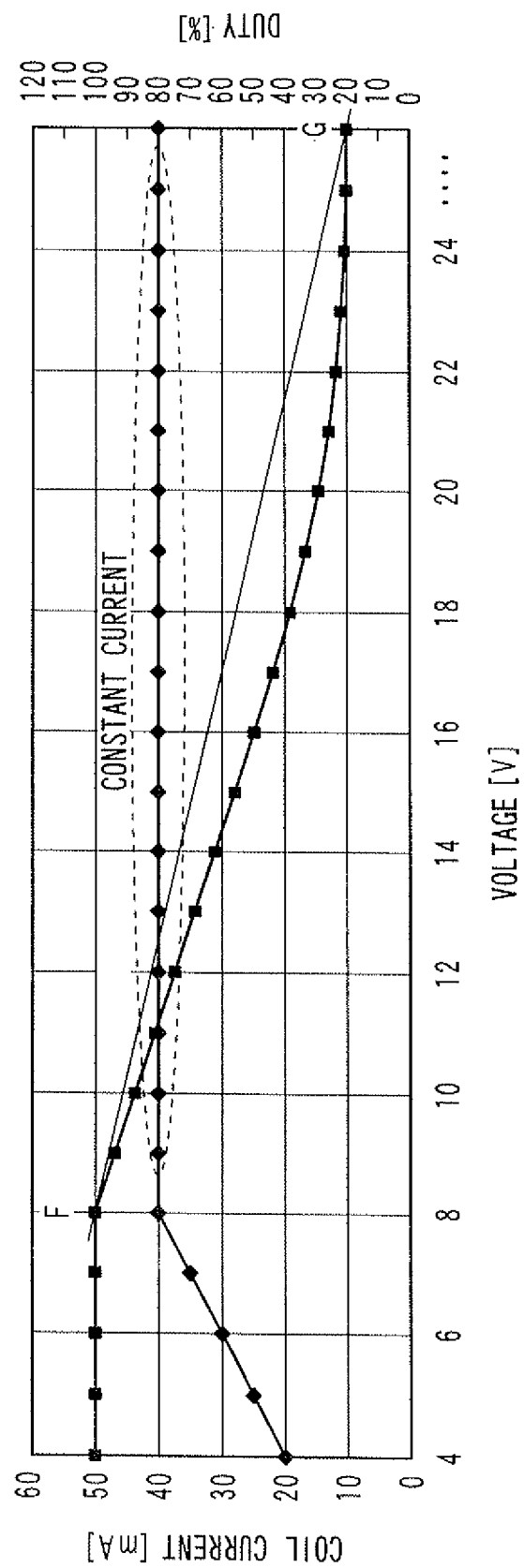
FIG. 10 is a graph showing an example of a duty ratio required to render a coil current constant when a voltage of a battery increases to 8 volt or more.

FIG. 10 is a graph showing an example of a duty ratio required to render the coil current constant when the voltage of the battery 1 increases to 8 volt or more.

Figure 12:
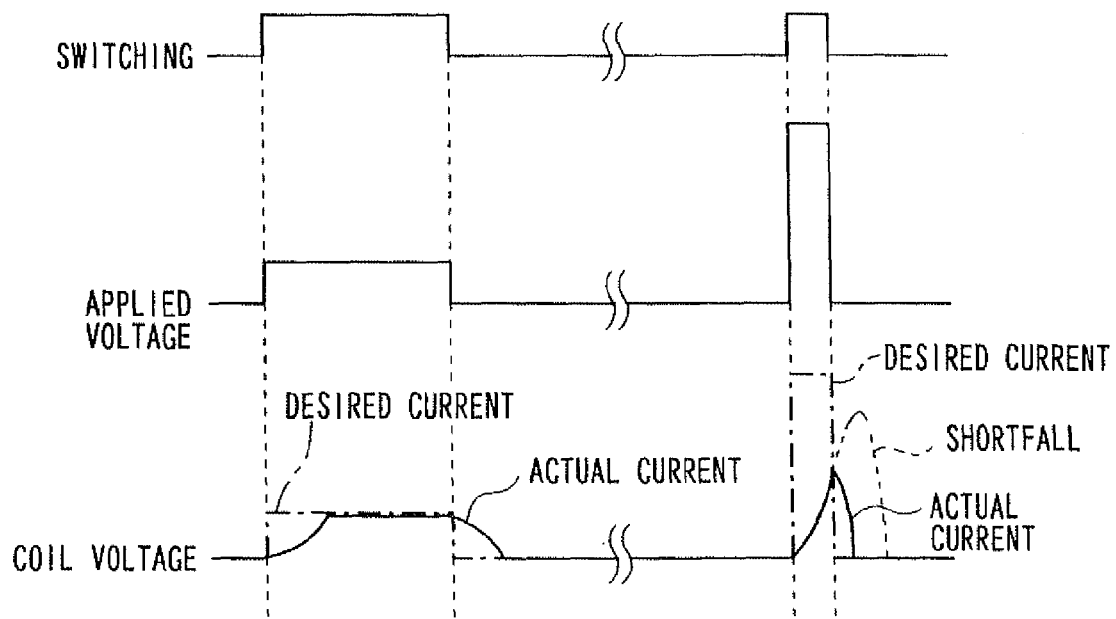
FIG. 12 is a time chart showing an ON-OFF waveform (activation and deactivation waveform) of a coil switch and a coil current waveform when voltage of a power source changes.

As shown in FIG. 10, the duty ratio required to render the coil current constant changes with increase in the voltage of the battery 1. It is noted that the change in the duty ratio is not in proportion to change in the voltage of the battery 1. Specifically, when a relation of the duty ratio in proportion to change in the voltage of the battery 1 is represented by a linear straight line, the duty ratio becomes gradually greater with respect to the linear straight line. Specifically, as described previously with reference to FIG. 12, when the voltage of the battery 1 increases, the duty control decreases the energization period. In this case, the energization period may end before the coil current increases to the desired current. Consequently, the coil current may become insufficient, and desired electric current cannot be supplied.

Referring to FIG. 10, the duty ratio gradually decreases with increase in the voltage of the battery 1. In consideration of this, in the relay control circuit according to the present embodiment, the threshold circuit 6 sets the threshold according to the characteristic curve of the duty ratio in which decrease in the duty ratio becomes small gradually with increase in the voltage of the battery 1.

The threshold may be set to be on the duty ratio characteristic curve. Alternatively, it suffices that the threshold is set with respect to the voltage of the battery 1 so that the duty ratio is on or above the duty ratio characteristic curve, at least. In consideration of this, according to the present embodiment, as shown in FIG. 10, the duty ratio characteristic curve is approximated to a linear-function straight line, and the linear-function straight line is set to be above, i.e., on the upper side of the characteristic curve in FIG. 10. For example, a point F, when the voltage of the battery 1 is 8V, and a point G, when the voltage of the battery 1 increases to a predetermined voltage, are determined. Subsequently, the points F, G are connected by a straight line to obtain the linear-function straight line, which is an approximated line of the duty ratio characteristic curve for determining the threshold.

The threshold circuit 6 is caused to store the obtained linear-function straight line. The threshold circuit 6 is further caused to set the threshold according to the stored linear-function straight line. Thereby, the coil current can be rendered sufficient and not excessive. Thus, electric current supplied to the relay coil 10 can be rendered substantially constant.

As described above, the relay control circuit according to the present embodiment performs the on-off control of the relay coil 10 (load element). The relay control circuit sets the threshold according to the characteristic curve of the duty ratio in which the duty ratio decreases gradually with increase in the voltage of the battery 1, and decrease in the duty ratio with increase in the voltage of the battery 1 becomes small gradually. In this way, even when the voltage of the battery 1 changes (fluctuates), electric power supply to the relay coil 10 can be rendered substantially constant. Thereby, unnecessary power consumption can be reduced as much as possible.

(Fourth Embodiment)

As follows, the fourth embodiment will be described. In the above embodiments, a load control circuit such as the lamp control circuit or the relay control circuit including an analog circuitry is exemplified. The load control circuit such as the lamp control circuit or the relay control circuit may be configured of a logic circuit.

Figure 11:
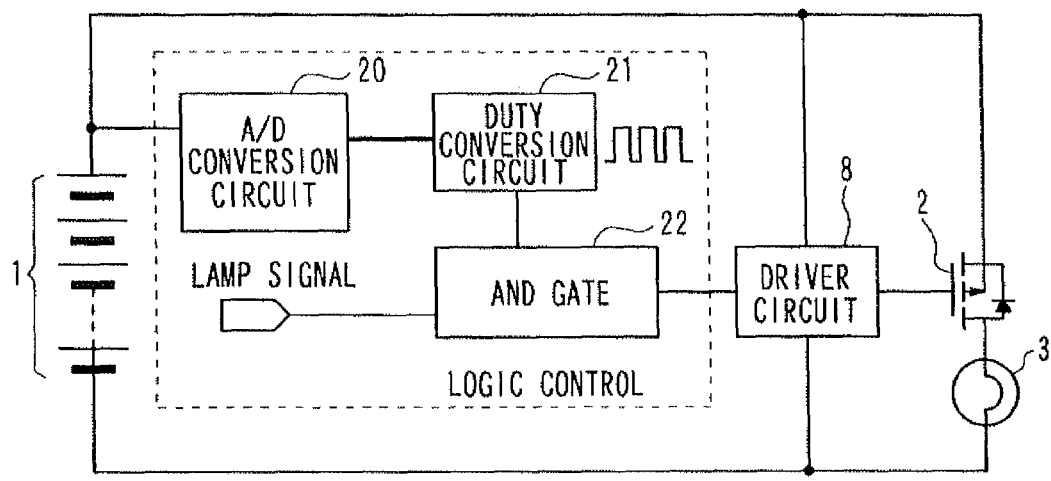
FIG. 11 is a circuit diagram showing a lamp control circuit configured of a logic circuit, according to a fourth embodiment of the present invention.

FIG. 11 is a circuit diagram showing a lamp control circuit similar to the lamp control circuit described in detail in the first embodiment. In the present embodiment, the lamp control circuit is configured of a logic circuit. Specifically, as shown in FIG. 11, the lamp control circuit includes a logic control unit including a digital conversion circuit 20, a duty conversion circuit 21, and an output logic circuit 22. The driver circuit 8 is controlled according to an output signal from the logic control unit, thereby activation and deactivation of the semiconductor switching element 2 is controlled.

The digital conversion circuit 20 is configured of an ND conversion circuit configured to perform analog to digital conversion of the voltage of the battery 1. The voltage of the battery 1 is equivalent to the power supply voltage. The duty conversion circuit 21 stores a data map, which is obtained by linear approximation of the above-described duty ratio characteristic shown in FIG. 4, or a function formula equivalent to the data map. The digital conversion circuit 20 performs the analog-digital conversion of the voltage of the battery 1 and outputs a signal of the converted voltage. The duty conversion circuit 21 receives the signal from the digital conversion circuit 20. Thus, the duty conversion circuit 21 sets a duty ratio corresponding to the signal from the digital conversion circuit 20, according to the data map or the function formula. The duty conversion circuit 21 generates an output signal having a pulse width corresponding to the duty ratio. The output logic circuit 22 is configured of an AND gate. The output logic circuit 22 outputs a logical sum of the output signal of the duty conversion circuit 21 and a lamp signal, which is an instruction signal for activation and deactivation of the lamp. When the lamp signal is activated to turn the lamp ON, the output logic circuit 22 generates an output signal of the duty ratio corresponding to the output signal from the duty conversion circuit 21. Thus, the driver circuit 8 generates an output signal according to the output signal from the output logic circuit 22.

In this way, the lamp control circuit may be configured of the logic circuit. According to the present embodiment, the lamp control circuit configured of the logic circuit can produce an effect equivalent to those of the first and second embodiments.

(Other Embodiment)

In the above first and second embodiments, the duty ratio characteristic curve related to increase in the voltage of the battery 1 is approximated by using a single straight line or two straight lines. It is noted that the duty ratio characteristic curve may be approximated by using three or more straight lines. In this case, circuits, in which zener diodes and the resistor elements are connected in series, may be provided by a number corresponding to the number of linear approximated straight lines, and each of the circuits may be connected between a zener diode and a resistor of the preceding circuit.

In the third embodiment, the linear-function straight line, which passes through the two points F, G of the duty ratio characteristic curve, is obtained, and the duty ratio characteristic curve is approximated to the linear-function straight line. The method of the third embodiment is one example. For example, duty ratios corresponding to predetermined voltages may be determined to be greater than duty ratios on the duty ratio characteristic curve when the power supply voltage is the predetermined voltages, and a linear-function straight line may be obtained by linear approximation of the determined duty ratios corresponding to the predetermined voltages.

In the above-described fourth embodiment, the lamp control circuit is configured of the logic circuit. The relay control circuit described in the third embodiment may also be configured of a logic circuit. In the fourth embodiment, the digital conversion circuit 20 is caused to perform the analog-digital conversion of the voltage of the battery 1, and the duty conversion circuit 21 is caused to set a duty ratio according to the converted voltage to generate the output signal corresponding to the duty ratio. Alternatively, the digital conversion circuit 20 may be configured to store a predetermined table, and the duty ratio may be set according to the predetermined table. Specifically, the predetermined table may be a table corresponding to the data map obtained by linear approximation of the duty ratio characteristic shown in FIG. 4 or a function formula.

Summarizing the above embodiments, a load control circuit includes: a switch device 2 configured to control a voltage applied to a load element 3, 10 according to an electric power supply from a power source 1; a driver circuit 8 configured to control activation and deactivation of the switch device 2; and a circuit portion 4 to 7, to 22 configured to set a duty ratio for causing the driver circuit 8 to activate the switch device 2 and outputting the duty ratio to the driver circuit 8. The load control circuit is configured to activate the switch device 2 according to the duty ratio to control the voltage applied to the load element 3, 10. The circuit portion 4 to 7, 20 to 22 is configured to set the duty ratio according to a duty ratio characteristic curve in which the duty ratio decreases gradually with increase in a power supply voltage, and decrease in the duty ratio with increase in the power supply voltage becomes small gradually.

In this way, the threshold is set according to the duty ratio characteristic curve, in which the duty ratio decreases gradually with increase in the power supply voltage, and decrease in the duty ratio with increase in the power supply voltage becomes small gradually. Thus, when the load element is a lamp 3, such as a filament-type lamp, having a nonlinear voltage-illumination characteristic, illumination of the lamp 3 can be regulated within a constant range, and flickering of the lamp 3 can be restricted. Alternatively, when the load element is a relay coil 10, electric power supply to the relay coil 10 can be rendered substantially constant even when the voltage of the battery 1 changes (fluctuates). Thereby, unnecessary power consumption can be reduced as much as possible.

In the load control circuit, the circuit portion is a lamp control circuit including: a periodic waveform generator 5 configured to generate a periodic voltage waveform; a threshold circuit 6 configured to generate a threshold voltage Vc to be compared with the periodic voltage waveform; and a comparator 7 configured to: compare the periodic voltage waveform with the threshold voltage Vc; set a duty ratio to cause the driver circuit 8 to activate the switch device 2 according to a comparison result; and output the duty ratio to the driver circuit 8. The lamp control circuit is configured to activate the switch device 2 according to the duty ratio outputted from the comparator 7 to the driver circuit 8 to control the voltage applied to the lamp 3 having a nonlinear voltage-illumination characteristic. The threshold circuit 6 is configured to output the threshold voltage Vc, such that the threshold voltage Vc satisfies a relationship of the duty ratio relative to the applied voltage to the lamp 3 having a nonlinear voltage-illumination characteristic, the relationship being obtained by approximating a characteristic curve of the duty ratio, which renders an illumination of the lamp 3 constant with increase in the voltage of the power source 1, by a linear-function straight line using a formula $(V^2 \times DUTY)^{1/2}$ of an effective value of the applied voltage V, the DUTY being the duty ratio, and the V being the applied voltage to the lamp 3.

In this way, in order to regulate the illumination of the lamp 3, such as a filament-type lamp having a nonlinear voltage-illumination characteristic, within a certain range, the duty ratio of the duty control is determined such that the illumination of the lamp 3 becomes constant even when the voltage of the power source 1 changes. Further, the curve representing the relationship between the duty ratio and the voltage V of the power source 1 corresponding to the duty ratio is approximated to the linear-function straight line. Thus, the threshold circuit 6 sets the threshold voltage Vc to produce the characteristic of the approximated linear-function straight line. The inclination of the approximated linear-function straight line is calculated based on the relationship between the duty ratio and the effective value $(V^2 \times DUTY)^{1/2}$ of the voltage applied to the lamp 3. Therefore, the linear approximation can be correctly performed to enable to render the illumination of the lamp 3 further constant. Thus, the lamp control circuit configured to regulate illumination of the lamp 3 having a nonlinear voltage-illumination characteristic within a constant range and restrict flickering of the lamp 3 can be produced.

Specifically, the threshold circuit 6 may be configured to divide the voltage of the power source 1 by using a voltage divider resistor including a first resistor element R1 and a second resistor element R2, thereby to generate the threshold voltage Vc, which satisfies the relationship of the duty ratio relative to the applied voltage, the relationship being approximated by the linear-function straight line.

The threshold circuit 6 may include a first zener diode ZD1 on a high side of the first resistor element R1 and the second resistor element R2. When the voltage of the power source 1 becomes greater than or equal to a zener breakdown voltage of the first zener diode ZD1, the voltage divider resistor including the first resistor element R1 and the second resistor element R2 may divide the voltage, thereby to set the duty ratio.

The threshold circuit 6 may be configured to: divide a variable range of the voltage of the power source 1 into two regions; perform linear approximation in the two regions by two linear-function straight lines; cause the first zener diode ZD1 and the first and second resistor elements R1, R2 to generate the threshold voltage Vc from a voltage at a control start point of a duty control to a dividing point; and cause first and second zener diodes ZD1, ZD2 and first to third resistor elements R1 to R3 to generate the threshold voltage Vc from the dividing point to a point at which the voltage of the power source 1 becomes a maximum value in the variable range, wherein a circuit, which includes the second zener diode ZD2 and the third resistor element R3 connected in series, is connected with the second resistor element R2 in parallel at an intermediate point between the first and second resistor elements R1, R2.

Thus, the linear approximation may be performed in this way. When linear approximation is performed by using two straight lines in this way, the deviation between an actual duty characteristic curve and the approximated linear-function straight lines can be reduced, compared with linear approximation by using a single straight line. Therefore, the linear approximation can be further correctly performed to render the illumination of the lamp 3 constant. Thus, the lamp control circuit configured to approximate illumination of the lamp 3, such as a filament-type lamp having a nonlinear voltage-illumination characteristic, to a constant illumination and restrict flickering of the lamp 3 can be produced.

In the load control circuit, the circuit portion is a relay control circuit including: a periodic waveform generator 5 configured to generate a periodic voltage waveform; a threshold circuit 6 configured to generate a threshold voltage Vc to be compared with the periodic voltage waveform; and a comparator 7 configured to: compare the periodic voltage waveform with the threshold voltage Vc; set a duty ratio to cause the driver circuit 8 to activate the switch device 2 according to a comparison result; and output the duty ratio to the driver circuit 8. The relay control circuit is configured to activate the switch device 2 according to the duty ratio outputted from the comparator 7 to the driver circuit 8 to control a coil current supplied to a relay coil 10 thereby to activate a relay switch. The threshold circuit 6 is configured to: approximate a linear-function straight line according to the duty ratio characteristic curve, such that a duty ratio on the linear-function straight line corresponding to a predetermined voltage becomes greater compared with a duty ratio corresponding to a power supply voltage being the predetermined voltage on the duty ratio characteristic curve; set the duty ratio using the linear-function straight line; and output the threshold voltage Vc to cause the duty ratio.

In this way, even when the power supply voltage changes (fluctuates), electric power supply to the relay coil 10 can be rendered substantially constant. Thereby, unnecessary power consumption can be reduced as much as possible.

It should be appreciated that while the processes of the embodiments of the present invention have been described herein as including a specific sequence of steps, further alternative embodiments including various other sequences of these steps and/or additional steps not disclosed herein are intended to be within the steps of the present invention.

Various modifications and alternations may be diversely made to the above embodiments without departing from the spirit of the present invention.

What is claimed is:

1. A load control circuit comprising:
   a switch device configured to control a voltage applied to a load element according to an electric power supply from a power source;
   a driver circuit configured to control activation and deactivation of the switch device; and
   a circuit portion configured to set a duty ratio and output the duty ratio to the driver circuit for causing the driver circuit to activate the switch device, wherein
   the driver circuit is configured to activate the switch device according to the duty ratio to control the voltage applied to the load element, and
   the circuit portion is further configured to set the duty ratio according to a duty ratio characteristic curve in which the duty ratio decreases gradually with increase in a voltage of the power source, and decrease in the duty ratio with increase in the voltage of the power source becomes small gradually,
   wherein
   the circuit portion is a lamp control circuit including:
   a periodic waveform generator configured to generate a periodic voltage waveform;
   a threshold circuit configured to generate a threshold voltage to be compared with the periodic voltage waveform; and
   a comparator configured to:
      compare the periodic voltage waveform with the threshold voltage to obtain a comparison result;
      set a duty ratio to cause the driver circuit to activate the switch device according to the comparison result; and
      output the duty ratio to the driver circuit, wherein
   the comparator is configured to cause the driver circuit to activate the switch device according to the duty ratio outputted to the driver circuit to control a voltage applied to the lamp having a nonlinear voltage-illumination characteristic, and
   the threshold circuit is configured to output the threshold voltage, such that the threshold voltage satisfies a relationship obtained by approximating a characteristic curve of the duty ratio, which renders an illumination of the lamp substantially constant with increase in a voltage of the power source, by a linear-function straight line using a formula $(V^2 \times DUTY)^{1/2}$ of an effective value of a voltage applied to the lamp, the DUTY being the duty ratio, and the V being the applied voltage to the lamp.

2. The lamp control circuit according to claim 1, wherein
   the threshold circuit includes a voltage divider resistor including a first resistor element and a second resistor element, and
   the threshold circuit is further configured to divide the voltage of the power source by using the voltage divider resistor to generate the threshold voltage, which satisfies the relationship.

3. The lamp control circuit according to claim 2, wherein
   the threshold circuit further includes a first zener diode on a high side of the first resistor element and the second resistor element, and
   the voltage divider resistor including the first resistor element and the second resistor element is configured to divide the voltage to set the duty ratio when the voltage of the power source becomes greater than or equal to a zener breakdown voltage of the first zener diode.

4. The lamp control circuit according to claim 3, wherein the threshold circuit further includes a second zener diode and a third resistor element, a variable range of the voltage of the power source is divided into a first region and a second region through a diving point voltage; the characteristic curve of the duty ratio is approximated by two linear-function straight lines in the first region and the second region, the threshold circuit is further configured to:
   cause the first zener diode, the first resistor element, and the second resistor element to generate the threshold voltage in the first region from a voltage at a control start point of a duty control to the dividing point voltage; and
   cause the first zener diode, the second zener diode, the first resistor element, the second resistor element, and the third resistor element to generate the threshold voltage in the second region from the dividing point voltage to a maximum voltage of the power source in the variable range, wherein the second zener diode and the third resistor element connected in series is further connected with the second resistor element in parallel at an intermediate point between the first resistor element and the second resistor element.

5. A load control circuit comprising:
a switch device configured to control a voltage applied to a load element according to an electric power supply from a power source;
a driver circuit configured to control activation and deactivation of the switch device; and
a circuit portion configured to set a duty ratio and output the duty ratio to the driver circuit for causing the driver circuit to activate the switch device, wherein the driver circuit is configured to activate the switch device according to the duty ratio control the voltage applied to the load element, and the circuit portion is further configured to set the duty ratio according to a duty ratio characteristic curve in which the duty ratio decreases gradually with increase in a voltage of the power source, and decrease in the duty ratio with increase in the voltage of the power source becomes small gradually, wherein
the circuit portion is a relay control circuit including:
a periodic waveform generator configured to generate a periodic voltage waveform;
a threshold circuit configured to generate a threshold voltage to be compared with the periodic voltage waveform; and
a comparator configured to:
   compare the periodic voltage waveform with the threshold voltage to obtain a comparison result;
   set a duty ratio to cause the driver circuit to activate the switch device according to the comparison result; and
   output the duty ratio to the driver circuit, wherein the comparator is configured to output the duty ratio to the driver circuit to activate the switch device according to the duty ratio to control a coil current supplied to a relay coil thereby to activate a relay switch, and the threshold circuit is configured to:
   approximate the duty ratio characteristic curve to a linear-function straight line, such that a duty ratio, which is on the linear-function straight line and corresponds to a predetermined voltage, becomes greater than a duty ratio, which is on the duty ratio characteristic curve and corresponds to a power supply voltage being the predetermined voltage;
   set the duty ratio using the linear-function straight line; and
   output the threshold voltage to cause the duty ratio.

* * * * *